(12) United States Patent
Daniel et al.

(10) Patent No.: US 9,300,434 B2
(45) Date of Patent: Mar. 29, 2016

(54) ZERO SUM SIGNALING IN A DIGITAL SYSTEM ENVIRONMENT

(75) Inventors: Erik S. Daniel, Rochester, MN (US); Robert W. Techentin, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 123 days.

(21) Appl. No.: 14/125,292

(22) PCT Filed: Jun. 8, 2012

(86) PCT No.: PCT/US2012/041494
§ 371 (c)(1),
(2), (4) Date: Feb. 19, 2014

(87) PCT Pub. No.: WO2012/170780
PCT Pub. Date: Dec. 13, 2012

(65) Prior Publication Data
US 2014/0208181 A1    Jul. 24, 2014

Related U.S. Application Data (60) Provisional application No. 61/495,701, filed on Jun. 10, 2011.

(51) Int. Cl.
*H03M 13/11* (2006.01)
*H04L 1/00* (2006.01)
(Continued)

(52) U.S. Cl.
CPC .............. *H04L 1/004* (2013.01); *G06F 11/10* (2013.01); *G06F 13/423* (2013.01); *H03M 13/51* (2013.01); *H04L 1/0042* (2013.01); *H04L 25/14* (2013.01); *H04L 25/4908* (2013.01)

(58) Field of Classification Search
CPC ..................................................... H04L 1/0057
USPC ........................... 714/752, 755, 704, 805, 718
See application file for complete search history.

(56) References Cited

U.S. PATENT DOCUMENTS 5,311,521 A  *  5/1994  Fitingof et al. ............... 714/755
6,614,369 B1     9/2003  Widmer
(Continued)

FOREIGN PATENT DOCUMENTS

WO        2010015948 A1      2/2010

OTHER PUBLICATIONS

Notification of Transmittal of the International Search Report and the Written Opinion of the International Searching Authority for patent application No. US2012/041494, mailed Feb. 19, 2013. 9 pages.
(Continued)

*Primary Examiner* — Fritz Alphonse
(74) *Attorney, Agent, or Firm* — Shumaker & Sieffert, P.A.

(57) ABSTRACT

Zero sum signaling schemes utilize coding across data words to allow the use of single-ended buffers while mitigating simultaneous switching noise (SSN) in digital systems. Zero sum signaling may include balanced zero sum coding (target disparity=0) and nearly balanced zero sum coding (target disparity=±d). Zero sum signaling may reduce simultaneous switching noise as compared to single-ended signaling while allowing a reduction in the number of physical channels (e.g. circuit board traces) by nearly a factor of two as compared to differential signaling.

19 Claims, 9 Drawing Sheets

(51) Int. Cl.
  *H04L 25/49* (2006.01)
  *H04L 25/14* (2006.01)
  *H03M 13/51* (2006.01)
  *G06F 11/10* (2006.01)
  *G06F 13/42* (2006.01)

(56) References Cited

U.S. PATENT DOCUMENTS

| | | | |
|---|---|---|---|
| 7,023,365 B1 * | 4/2006 | Mitchell et al. | 341/67 |
| 7,324,590 B2 * | 1/2008 | Abrishamkar et al. | 375/233 |
| 7,324,950 B2 * | 1/2008 | Sherman | 705/4 |
| 7,768,429 B2 | 8/2010 | Bae et al. | |
| 7,949,977 B2 | 5/2011 | Kouzaki et al. | |
| 2003/0088317 A1 | 5/2003 | Sessions et al. | |
| 2009/0168575 A1 | 7/2009 | Messier | |
| 2011/0025533 A1 | 2/2011 | Abbasfar | |

OTHER PUBLICATIONS

International Preliminary Report on Patentability from corresponding international application No. PCT/US2012/041494, mailed Dec. 27, 2013, 6 pages.

Lin et al., "Balance of 0, Bits for Huffman and Reversible Variable-Length Coding", IEEE Transactions on Communications, vol. 52, No. 3, Mar. 2004, 3 pp.

Tallini et al., "Balanced Codes with Parallel Encoding and Decoding", IEEE Transactions on Computers, vol. 48, No. 8, Aug. 1999, 21 pp.

Tallini et al., "Design of Balanced and Constant Weight codes for VLSI Systems", IEEE Transactions on Computers, vol. 47, No. 5, May 1998, 17 pp.

* cited by examiner

ZERO SUM SIGNALING IN A DIGITAL SYSTEM ENVIRONMENT

CROSS REFERENCE TO RELATED APPLICATIONS

This application is a national stage entry under 35 U.S.C. §371 of PCT Application No. PCT/US2012/041494, filed Jun. 8, 2012, which claims the benefit of U.S. Provisional Application No. 61/495,701, filed Jun. 10, 2011. The entire contents of PCT Application No. PCT/US2012/041494 and U.S. Provisional Application No. 61/495,701 are incorporated herein by reference.

TECHNICAL FIELD

The disclosure relates to interconnection architectures for digital systems.

BACKGROUND

Digital systems make extensive use of high speed electrical interconnects in routing signals among processing elements or between processing elements and memory. The design of these high speed interconnects, including all of their associated components (active buffers and their associated power delivery, packaging components, printed circuit board traces, connectors, etc.) constitutes a large fraction of the effort associated with developing many digital systems, and often the limitations associated with these components significantly constrain overall system performance. In addition, as overall system performance increases, there is a corresponding scaling of bandwidth between processing elements and in processor-memory paths.

Single-ended signaling is a commonly used method of transmitting electrical signals. One wire carries a varying voltage that represents the signal, while another wire is connected to a reference voltage, usually ground. An alternative to single-ended signaling is differential signaling. In differential signaling two complementary signals are sent on two separate wires. An advantage of single-ended over differential signaling is that fewer interconnects are needed to transmit multiple signals. If there are n signals, single-ended signaling uses n interconnects, one for each signal, plus one shared interconnect for ground. Differential signaling, on the other hand, uses at least 2n wires. A disadvantage of single-ended signaling is that large power supply voltage transients may result when multiple interconnects are switched simultaneously. This phenomenon is referred to a simultaneous switching noise (SSN). Differential signaling has many advantages (e.g., reduced crosstalk sensitivity, reduced simultaneous switching noise, etc.), but uses twice the number of interconnect traces as single-ended signaling.

The use of balanced codes has been proposed, for example, for encoding of unchangeable data on a laser disk. Examples of such balanced coding schemes can be found in: D. E. Knuth, "Efficient balanced codes," IEEE Transactions on Information Theory, vol. 32, no. 1, pp. 51-53, 1986.

SUMMARY

In general, the disclosure is directed to balanced and nearly balanced zero sum signaling schemes. The balanced and nearly balanced zero sum signaling schemes may be used in, for example, high performance computing systems, or in any environment in which it may be desirable to reduce simultaneous switching noise while still minimizing the number of interconnects required to transmit data.

In one example, the disclosure is directed to a system comprising a plurality of processing elements that communicate using n-bit data words, a plurality of encoders, each associated with a different one of the plurality of processing elements, and each of which receives an n-bit data word from the associated processing element and encodes the n-bit data word into a corresponding balanced (n+p)-bit data word comprised of an n-bit modified data word having an equal number of ones and zeroes and a p-bit parity word, a plurality of parallel interconnects that route the (n+p)-bit modified data words between the plurality of processing elements, and a plurality of decoders, each associated with a different one of the plurality of processing elements, and each of which decodes (n+p)-bit modified data words into the corresponding n-bit data words for receipt by the associated one of the plurality of processing elements.

In another example, the disclosure is directed to a system comprising a first processing element and a second processing element that communicate using n-bit data words, an encoder associated with the first processing element that receives an n-bit data word from the first processing element and encodes the n-bit data word into a corresponding (n+p)-bit balanced data word comprised of a balanced n-bit modified data word having an equal number of ones and zeroes and a p-bit parity word, an (n+p)-bit data bus that transmits the (n+p)-bit data word from the first processing element to the second processing element, and a decoder associated with the second processing element that decodes the (n+p)-bit data word into the corresponding n-bit data word for receipt by the second processing element.

In another example, the disclosure is directed to a method comprising generating an n-bit data word at a first processing element, encoding the n-bit data word into a corresponding (n+p)-bit balanced data word comprised of a n-bit modified data word having an equal number of ones and zeroes and a p-bit parity word, transmitting the (n+p)-bit data word from the first processing element to the second processing element, and decoding the (n+p)-bit data word into the corresponding n-bit data word for receipt by the second processing element.

In another example, the disclosure is directed to a system comprising a plurality of devices that communicate using n-bit data words, a plurality of encoders, each associated with a different one of the plurality of devices, and each of which receives an n-bit data word from the associated device and encodes the n-bit data word into a corresponding (n+p)-bit data word comprised of an n-bit modified data word and a p-bit parity word, the n-bit modified data word having a number of ones and a number of zeroes, wherein the number of ones is within a disparity ±d as compared to the number of zeroes, a plurality of parallel interconnects that route the (n+p)-bit modified data words between the plurality of devices, and a plurality of decoders, each associated with a different one of the plurality of devices, and each of which decodes one or more of the (n+p)-bit modified data words into the corresponding n-bit data words for receipt by the associated one of the plurality of devices.

In another example, the disclosure is directed to a method comprising generating an n-bit data word at a first device, encoding the n-bit data word into a corresponding (n+p)-bit data word comprised of an n-bit modified data word and a p-bit parity word, the n-bit modified data word having a number of ones and a number of zeroes, wherein the number of ones is within a disparity ±d as compared to the number of zeroes, transmitting the (n+p)-bit data word from the first device to a second device, and decoding the (n+p)-bit data word into the corresponding n-bit data word for receipt by the second device.

The details of one or more examples are set forth in the accompanying drawings and the description below. Other features and advantages will be apparent from the description and drawings, and from the claims.

DETAILED DESCRIPTION

"Zero sum signaling" as described herein utilizes coding across data words to allow the use of single-ended buffers while mitigating simultaneous switching noise (SSN) in digital systems, or in any environment in which it may be desirable to reduce simultaneous switching noise while still minimizing the number of interconnects required to transmit data. Implementation of the zero sum signaling concepts described herein, both balanced zero sum signaling (target disparity=0) and nearly balanced zero sum signaling (target disparity=±d, where d is any positive integer) in digital systems may reduce simultaneous switching noise as compared to single-ended signaling, and allow a reduction in the number of physical channels (e.g. circuit board traces) by nearly a factor of two as compared to differential signaling.

Consider a set of buffers driving 2N interconnect traces, where at any given time N of these traces are in a logic high state (sourcing current), and the other N of these traces are in a logic low state (sinking current), but without the restriction that a differential system would have (i.e. that the high and low state pairs must be adjacent). This will be referred to herein as "balanced" zero sum signaling or "balanced" zero sum coding (target disparity=0) as it preserves one of the features of a differential buffer system; namely, the constant supply current sourcing independent of the output state (the "zero sum"). This constant current feature translates into reduced switching current transients, and hence lower power supply voltage transients (lower [inductance]*[switching current] or L*dI/dt) referred to as "simultaneous switching noise" (SSN). Using single-ended traces with a balanced zero sum signaling scheme, it is theoretically possible to transmit more data down the 2N traces than would be possible with a single-ended or differential signaling protocol, as is shown in Table 1 below. Note that the formula shown in Table 1 for the number of zero sum bits comes from counting the number of codes available with 2N bits in which N bits are ones and N bits are zeroes. As N grows, the number of zero sum data bits approaches the single-ended data bit limit.

TABLE 1

Comparison of Single-ended, Differential, and (balanced) Zero Sum Signaling Schemes.

| Number of Traces (2N) | Single-ended Data Bits (2N) | Differential Data Bits (N) | Zero Sum Data Bits ($\log_2[(2N)!/(N!N!)]$) |
|---|---|---|---|
| 4 | 4 | 2 | 2.58 |
| 8 | 8 | 4 | 6.13 |
| 12 | 12 | 6 | 9.85 |
| 16 | 16 | 8 | 13.65 |
| 32 | 32 | 16 | 29.16 |
| 64 | 64 | 32 | 60.67 |

These formulae may be inverted to compute the number of traces that would be required to carry a fixed number of bits using these signaling schemes. The results of these formulae are showing in Table 2 below. In this example, Table 2 assumes an even number of traces for the balanced zero sum case, even number of traces (as otherwise an equal number of ones and zeros is not possible), computing the smallest even integer number of traces which can support the given number of data bits. It shall be understood, however, that the balanced zero sum signaling scheme may also be applied to implementations having an odd number of data bits, in which case the so-called "balanced" implementation may have a disparity of ±1 to accommodate an odd number of data bits.

TABLE 2

Traces Required for Various Signaling Schemes In Order to Support a Fixed Number of Data Bits.

| Number of Data Bits | Single Ended Traces | Differential Traces | Zero Sum Traces |
|---|---|---|---|
| 8 | 8 | 16 | 12 |
| 12 | 12 | 24 | 16 |

TABLE 2-continued

Traces Required for Various Signaling Schemes In Order to Support a Fixed Number of Data Bits.

| Number of Data Bits | Single Ended Traces | Differential Traces | Zero Sum Traces |
|---|---|---|---|
| 16 | 16 | 32 | 20 |
| 20 | 20 | 40 | 24 |
| 24 | 24 | 48 | 28 |
| 32 | 32 | 64 | 36 |

Figure 1:
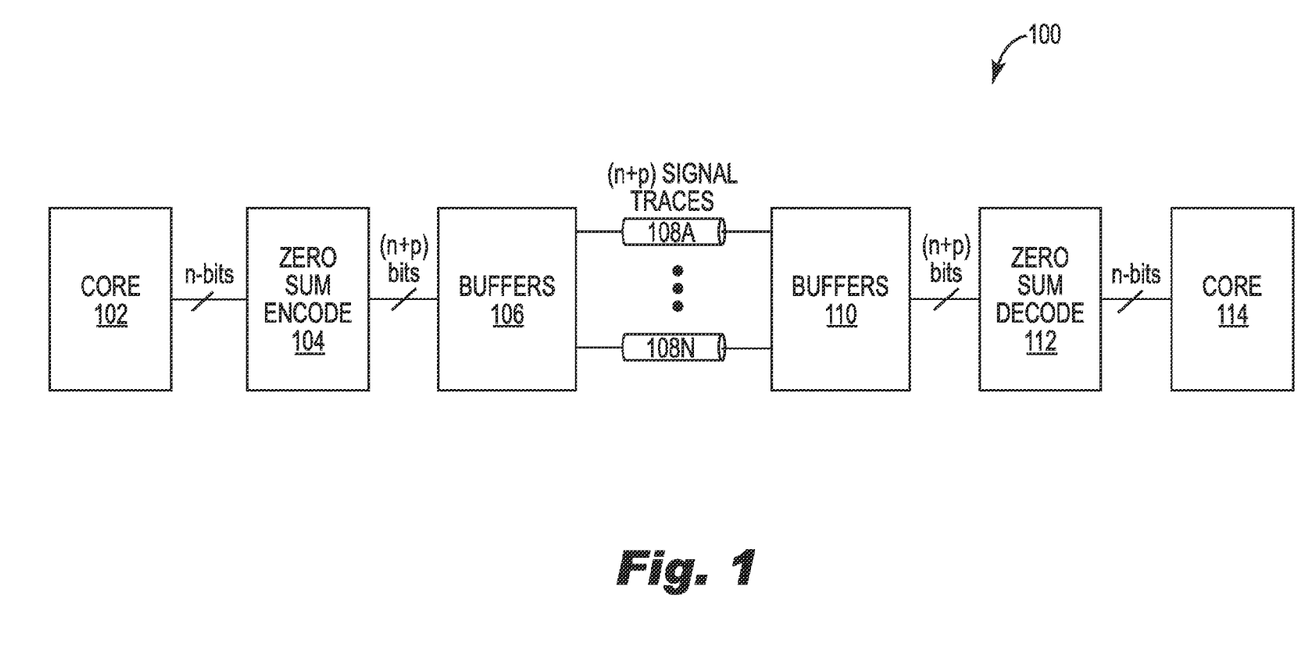
FIG. 1 is a block diagram illustrating an example implementation for a zero sum interconnect system for an n-bit bit data bus.

FIG. 1 is a block diagram illustrating an example implementation for a zero sum interconnect system 100 for an n-bit bit data bus. In FIG. 1, a first device 102 (e.g., a processing element, memory, buffer, or other computing system component) communicates with a second device 114. An n-bit data word output from device 102 are input to a zero sum encoder 104, which encodes the n-bit data word into a corresponding zero sum data word comprised of a balanced or nearly balanced n-bit modified data word and one or more parity bits, "p". In some examples, the one or more p-bit parity words may be balanced or nearly balanced. The (n+p) bit modified data word is then sent to output buffers 106, which in this example transmit the (n+p) bit modified data word to the appropriate input buffer 110 for the destination device 114. A zero sum decoder 112 receives the (n+p) bit modified data word, decodes the (n+p)-bit data word into the corresponding n-bit data word, and sends the original n-bit data word to device 114.

In a so-called "balanced" zero sum coding scheme, the n-bit modified data words have an equal number of zeroes and ones. In a "nearly balanced" zero sum coding scheme, the number of zeroes and ones need not be equal, but may differ by some finite target "disparity", d (e.g. d=±1, ±2, ±3, ±4, or any positive integer). This situation may result in finite current switching and hence increased (but still acceptable) SSN, but with the benefit of an expanded set of code words, and hence more theoretically available bits for a given number of wires. Thus, the notion of zero sum signaling as described herein encompasses both balanced and nearly balanced zero sum codes, and the term "target disparity" will be used to reflect the allowed difference between the number of zeroes and ones across the zero sum bus at any given instant in time.

The formula above for computation of the number of (encoded) bits which can be carried across a given number of traces can be extended to accommodate finite disparity as follows. The number of codewords available across 2N bits which have N-k ones and N+k zeroes (i.e. the codewords with a disparity equal to 2k) can be computed as follows:

$$Codes(k) = (2N)!/((N-k)!(N+k)!)$$

The same formula applies to the number of codewords with N+k ones and N-k zeroes. One computes the number of effective bits available through the use of all codewords by adding up the total number of codewords with disparity, d, less than or equal to a given value and taking the log base two of this number. For example, $$Bits(d=4) = \log_2[Codes(0) + 2*Codes(1) + 2*Codes(2)]$$

In Table 3 below, these formulae were used to compute the number of data bits which can be supported across a range of assumed physical interconnect traces using zero sum signaling with a range of allowable target disparities (abbreviated as "ZS±d"). The integer part of this computed number is represented in parenthesis, as generally one is only interested in using a bus to transmit an integer number of bits per word. For comparison, the number of single-ended (SE) and differential (Diff) data bits are shown as well.

TABLE 3

Data Bits Supported for Various Signaling Schemes Across a Fixed Number of Traces.

| Number of Traces | SE Data Bits | Diff Data Bits | ZS ± 0 Data Bits | ZS ± 2 Data Bits | ZS ± 4 Data Bits |
|---|---|---|---|---|---|
| 8 | 8 | 4 | 6.13 (6) | 7.51 (7) | 7.89 (7) |
| 12 | 12 | 6 | 9.85 (9) | 11.29 (11) | 11.77 (11) |
| 16 | 16 | 8 | 13.65 (13) | 15.13 (15) | 15.66 (15) |
| 20 | 20 | 10 | 17.50 (17) | 18.99 (18) | 19.56 (19) |
| 24 | 24 | 12 | 21.37 (21) | 22.88 (22) | 23.47 (23) |
| 32 | 32 | 16 | 29.16 (29) | 30.69 (30) | 31.32 (31) |

Again, these formulae may be inverted to compute the number of traces that would be required to carry a fixed number of bits using any of these signaling schemes. The results of these formulae are showing in Table 4 below. As before, the smallest even integer number of traces which can support at least the given number of data bits are computed. In this example, allowing finite disparity does open up the code space such that additional bits can be carried, but that the restriction to even integer numbers of traces is such that the incremental code space allowed by ZS±4 does not allow a reduction in trace count relative to ZS±2 (at least for the cases considered in the table).

TABLE 4

Number of Traces for Various Signaling Schemes (Including Zero Sum with Finite Disparity) In Order to Support a Fixed Number of Data Bits.

| Number of Data Bits | SE Traces | Diff Traces | ZS ± 0 Traces | ZS ± 2 Traces | ZS ± 4 Traces |
|---|---|---|---|---|---|
| 8 | 8 | 16 | 12 | 10 | 10 |
| 12 | 12 | 24 | 16 | 14 | 14 |
| 16 | 16 | 32 | 20 | 18 | 18 |
| 20 | 20 | 40 | 24 | 22 | 22 |
| 24 | 24 | 48 | 28 | 26 | 26 |
| 32 | 32 | 64 | 36 | 34 | 34 |

Figure 14:
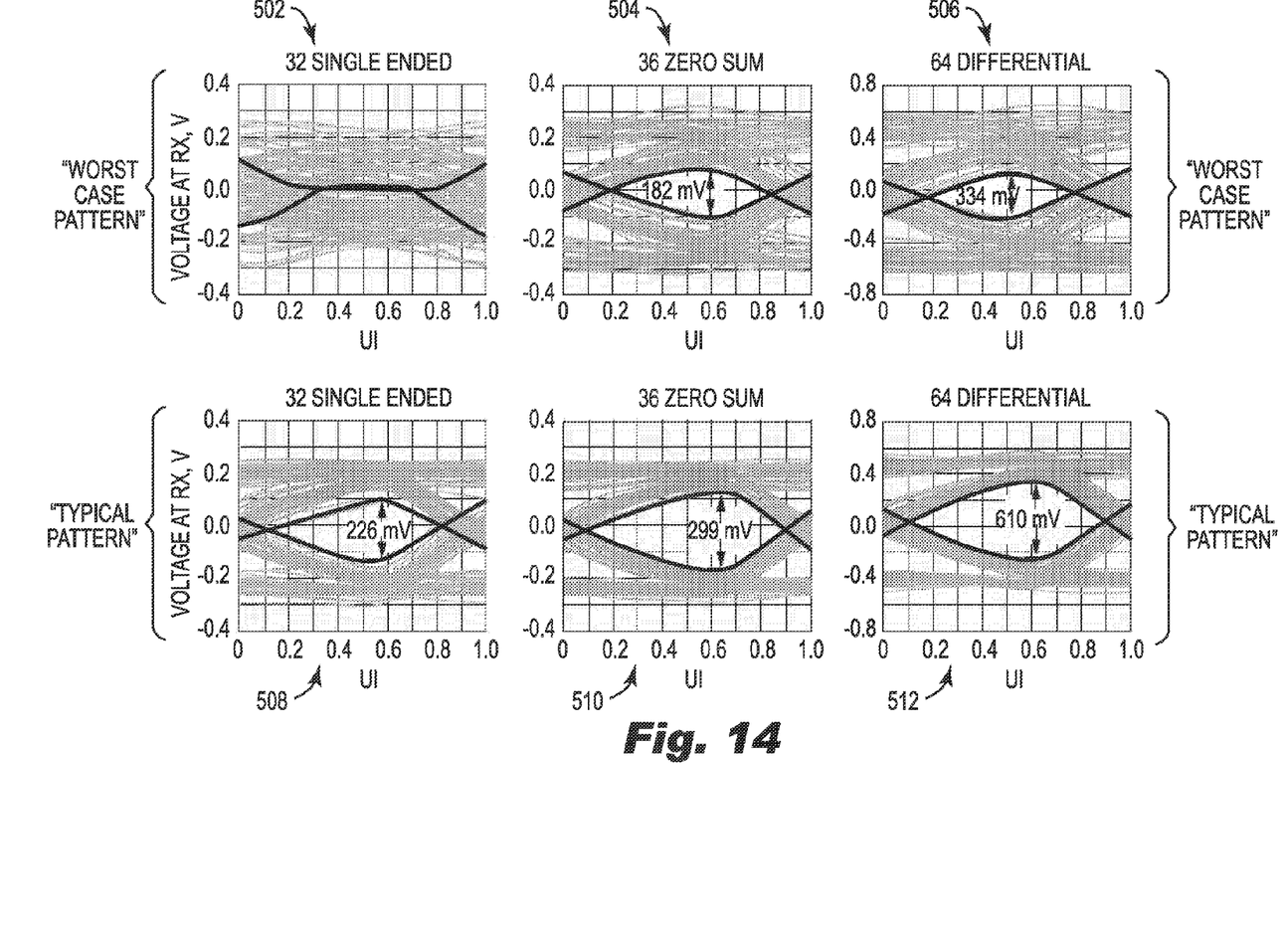
FIG. 14 shows representative simulated eye diagrams for select traces from simulated busses commmunicating 32 data bits.

As mentioned above, balanced (or nearly balanced) coding across a data bus or other set of interconnects may reduce simultaneous switching noise. To verify this, a model was constructed of a notional system with many parallel data links employing traditional single-ended signaling, traditional differential signaling, and zero sum signaling. Simulated eye diagrams were produced for each of these to assess the impact of simultaneous switching noise. FIG. 14 shows representative simulated eye diagrams for select traces from the simulated busses communicating 32 data bits. When worst case data patterns are applied, simultaneous switching noise results in complete closure of the eye in the single ended signaling case (502), but with zero sum coding applied (504), the eye remains open, very closely matching the differential signaling case (506) (albeit with an expected factor of two reduction in signal swing), but requiring only 36 physical traces versus 64 as required for single ended signaling. For typical data patterns, the zero sum coding case (510) closely matches the differential signaling case (512), and provided an improvement over the single ended signaling case (508) while requiring only 36 physical traces versus 64.

To implement the zero sum signaling concept, either in simulation or hardware, arbitrary data words may be encoded and decoded to and from a set of balanced or nearly balanced codewords, where the codewords contain an equal number of zero and one bits (in the balanced zero sum coding examples), or where the codewords contain a number of zero and one bits to within a finite target disparity (for the nearly balanced zero sum coding examples).

For purposes of the present disclosure, various example implementations for accomplishing balanced or nearly balanced zero sum coding will be described. These example implementations described herein include a first balanced zero sum coding implementation and a second balanced zero sum coding implementation. The example implementations also include nearly balanced zero sum coding schemes which can accommodate any finite nonzero target disparity. These will be described herein using examples of a first nearly balanced zero sum coding implementation with a target disparity of ±d (where d is any positive integer) and a second nearly balanced zero sum coding implementation having a target disparity of ±d (where d is any positive integer). Example of target disparities of ±2 and ±4 will be illustrated in detail, but it shall be understood that the techniques described herein may be used for any finite disparity and for any number of bits.

In the first balanced zero sum coding implementation, one bit in an n-bit word is complemented ("flipped") at a time until a balanced code (e.g., a word having the same number of ones and zeroes) is achieved. Example pseudo code for this implementation may be written as follows:

---

Let w = n-bit input word
For k = 0 to n−1
    Compute $w^{(k)}$ = w with first k bits flipped
    If $w^{(k)}$ has the same number of "1"s and "0"s, exit loop
Next k
Select balanced parity word $u_k$ which corresponds to number of bits flipped (k) in balanced word
Output codeword = $u_k w^{(k)}$, where k = the number of bits flipped, and $w^{(k)}$ = the disparity between the number of ones and the number of zeroes in the data word.

---

Figure 2:
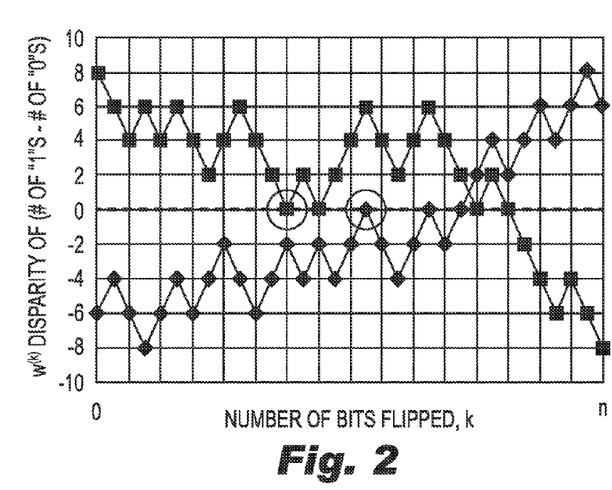
FIG. 2 is an example graph illustrating disparity versus bits flipped for two sample input codes using a first balanced zero sum coding method.

FIG. 2 is an example graph illustrating disparity versus bits flipped for two sample input codes using the first balanced zero sum coding method. The x-axis shows the number of bits flipped (k) and the y-axis shows the disparity $w^{(k)}$, or the difference between the number of ones and the number of zeroes in the data word. In general, the disparity at k=0 is the opposite sign of the disparity at k=n. Every step in k results in a disparity change of ±2. Therefore, the "random walk" associated with any input code must result in balance at some number of flipped bits in the first balanced zero sum coding method.

Figure 3:
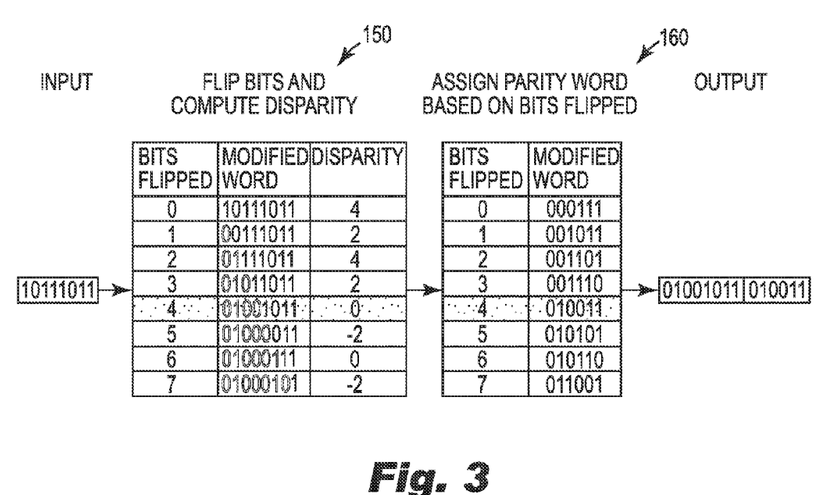
FIG. 3 shows is a diagram illustrating the number of bits flipped and an example assigned parity word for each number of bits flipped using the first balanced zero sum coding method.

FIG. 3 shows a diagram illustrating the number of bits flipped and an example assigned parity word for each number of bits flipped for an 8-bit data word using the first balanced zero sum coding method. The input in this example is 10111011. The table indicated by reference numeral 150 in FIG. 3 shows that the balance is achieved in this example after 4 bits are flipped, as the resulting modified word, 01001011, has an equal number of ones and zeroes and therefore the disparity is zero. The table indicated by reference numeral 160 illustrates example parity words that may be assigned representing the number of bits flipped. In this example, because balance coding was achieved after 4 bits were flipped, the parity word is 010011. The resulting 14-bit balanced code word is the modified, bit flipped word appended with the parity word, or 01001011010011.

Although example parity words are shown and described herein, it shall be understood that there are many choices of assignment of parity words to given number of bits flipped. In general the parity words may be balanced and have a 1-1 relationship with number of bits flipped.

Figure 4:
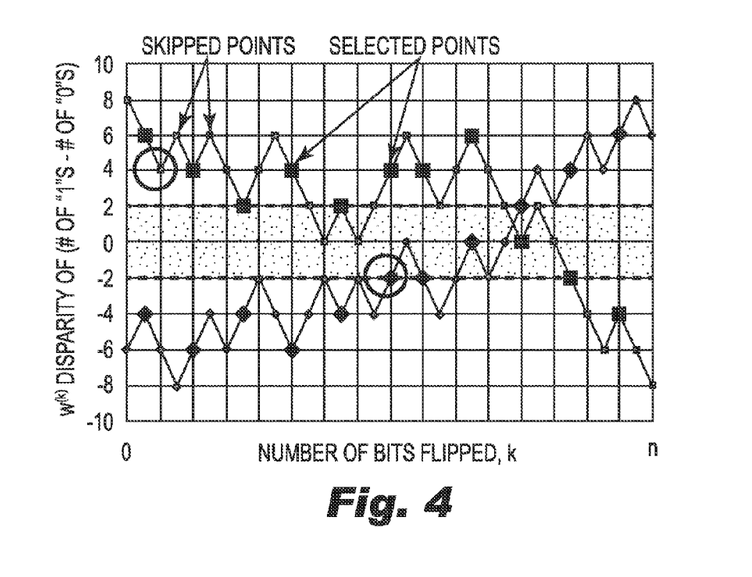
FIG. 4 is an example graph illustrating disparity versus bits flipped for two sample input codes using a first nearly balanced zero sum coding scheme (target disparity ±2).

FIG. 4 is an example graph illustrating disparity versus bits flipped for two sample input codes using the first nearly balanced zero sum coding implementation (target disparity ±2). The x-axis shows the number of bits flipped (k) and the y-axis shows the disparity $w^{(k)}$. In general, each of the set of selected k values is at most one step in k away from every possible k value (roughly every third value leads to a reduction in set of k by roughly a factor of 3. As in the first balanced zero sum coding implementation (disparity=0 discussed above), every step in k results in a disparity change of ±2, such that the bit-flipped word will be balanced (target disparity=0) at some k. Therefore, the disparity will be at most one step away (target disparity ±2) at any of the selected set of k.

Example pseudo code which may be used for implementing the first nearly balanced zero sum coding (±2 disparity) is as follows:

---

Let w = n-bit input word
For k = 0 to n−1
    If k is not one of the select set, Next k
    Compute $w^{(k)}$ = w with first k bits flipped
    If $w^{(k)}$ has the same number of "1"s and "0"s ±2, exit loop
Next k
Select balanced parity word $u_k$ which corresponds to number of bits flipped (k) in balanced word
Output codeword = $u_k w^{(k)}$

---

Figure 5:
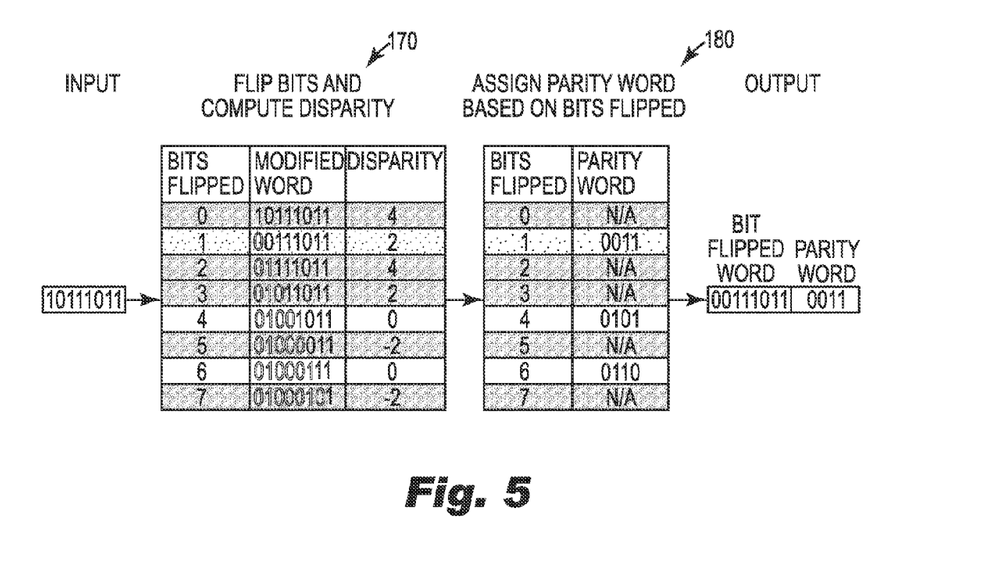
FIG. 5 shows is a diagram illustrating the number of bits flipped and an example assigned parity word for each number of bits flipped using a first nearly balanced zero sum coding scheme (target disparity ±2).

FIG. 5 shows is a diagram illustrating the number of bits flipped and an example assigned parity word for each number of bits flipped for an 8-bit data word using the first nearly balanced zero sum coding implementation (±2 target disparity). The input in this example is 10111011. The table indicated by reference numeral 170 in FIG. 5 shows that disparity within the ±2 bounds is achieved in this example after 1 bit is flipped, as the disparity between the number of ones and zeroes in the resulting modified word, 00111011, is two. The table indicated by reference numeral 180 illustrates example parity words that may be assigned representing the number of bits flipped. In this example, because nearly balanced ±2 target disparity coding was achieved after 1 bit was flipped, the parity word is 0011. The resulting 12-bit nearly balanced code word is the modified, bit flipped word appended with the parity word, or 001110110011.

Note that there is a reduction in number of bit-flipped choices that need to be checked in this ±2 target disparity method when compared with the first balanced zero sum coding implementation (disparity=0). The nearly balanced coding may therefore be simpler to implement in hardware (with fewer logic elements). Also, note that the ±2 target disparity implementation results in reduction in number of bits in the parity word as compared to the balanced (zero disparity) implementation described above with respect to FIGS. 2 and 3. This results in a corresponding reduction in the number of communication traces needed.

Figure 6:
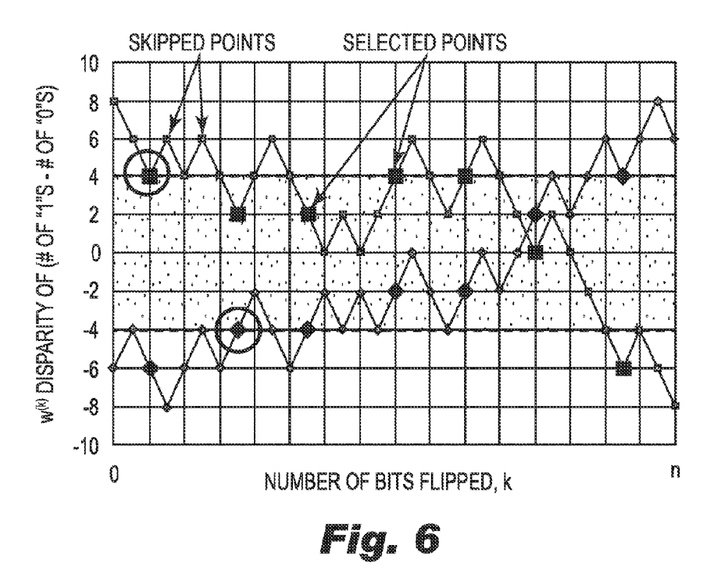
FIG. 6 is an example graph illustrating disparity versus bits flipped for two sample input codes using the first nearly balanced zero sum coding scheme (target disparity ±4).

FIG. 6 is an example graph illustrating disparity versus bits flipped for two sample input codes using the first nearly balanced zero sum coding implementation (target disparity ±4). The x-axis shows the number of bits flipped (k) and the y-axis shows the disparity $w^{(k)}$. In general, each set of selected k values is at most two steps in k away from every possible k value (roughly every fifth value leads to a reduction in set of k by roughly a factor of 5). As in the first balanced zero sum coding implementation, every step in k results in a disparity change of ±2, such that the bit-flipped word will be balanced (disparity=0) at some k. Therefore, the disparity will be at most two steps away (target disparity ±4) at any of the selected set of k. Note that in the general case of target disparity ±d, the number of selected k can be reduced by a factor (roughly) of 2d+1.

Example pseudo code which may be used for implementing the first nearly balanced zero sum coding (target disparity ±4) is as follows:

```
Let w = n-bit input word
For k = 0 to n−1
    If k is not one of the select set, Next k
    Compute w^(k) = w with first k bits flipped
    If w^(k) has the same number of "1"s and "0"s ±4, exit loop
Next k
Select balanced parity word u_k which corresponds to number of bits
flipped (k) in balanced word
Output codeword = u_k w^(k)
```

Note that the above procedure/pseudo code can be simply extended to accommodate any finite disparity ±d.

Figure 7:
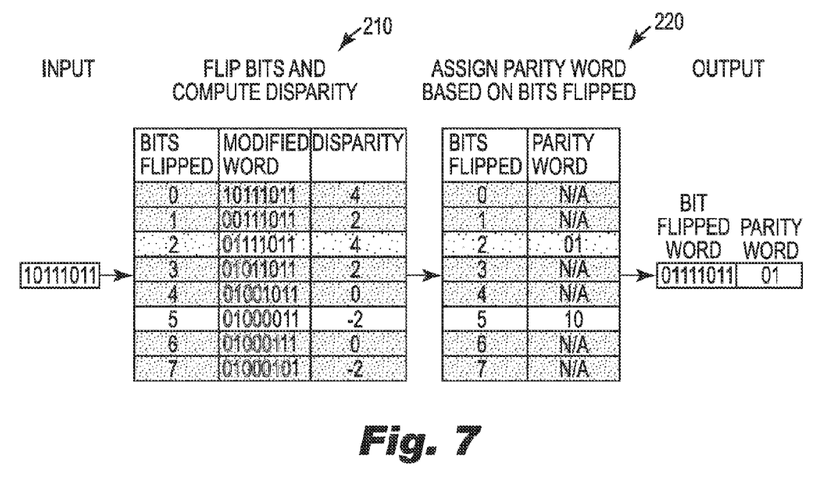
FIG. 7 is a diagram illustrating the number of bits flipped and an example assigned parity word for each number of bits flipped using the first nearly balanced zero sum coding scheme (target disparity ±4).

FIG. 7 is a diagram illustrating the number of bits flipped and an example assigned parity word for each number of bits flipped using the first nearly balanced zero sum coding implementation (target disparity ±4). The input in this example is 10111011. The table indicated by reference numeral 210 in FIG. 7 shows that nearly balanced ±4 disparity is achieved in this example after 2 bits are flipped, as the disparity between the number of ones and zeroes in the resulting modified word, 01111011, is four. The table indicated by reference numeral 220 illustrates example parity words that may be assigned representing the number of bits flipped. In this example, because nearly balanced ±4 disparity coding was achieved after 2 bits were flipped, the parity word is 01. The resulting 10-bit nearly balanced code word is the modified, bit flipped word appended with the parity word, or 0111101101.

Note that there is a reduction in number of bit-flipped choices that need to be checked in this ±4 disparity method when compared with the balanced implementation (disparity=0) described above, and when compared with the target disparity ±2 implementation. This method may therefore be simpler to implement in hardware (with fewer logic elements). Also, note that the ±4 disparity implementation results in reduction in number of bits in the parity word as compared to the balanced (target disparity of zero) implementation described above with respect to FIGS. 2 and 3, and when compared with the target disparity ±2 method described above with respect to FIGS. 4 and 5. This results in a corresponding reduction in the number of communication traces needed.

Figure 8:
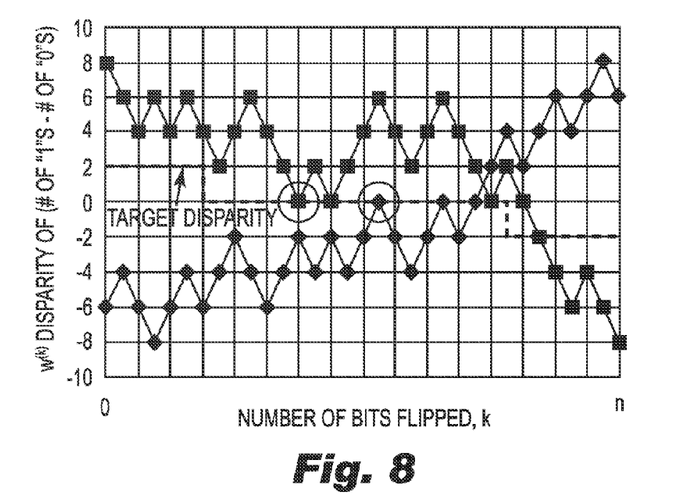
FIG. 8 is an example graph illustrating disparity versus bits flipped for two sample input codes using a second balanced zero sum coding scheme (target disparity=0).

FIG. 8 is an example graph illustrating disparity versus bits flipped for two sample input codes using the second balanced zero sum coding implementation. The x-axis shows the number of bits flipped (k) and the y-axis shows the disparity $w^{(k)}$. In this example, the $u_j$ are not required to be balanced. The $u_j$ are arranged in order from smallest to largest number of "1"s. This corresponds to changing the "target" number of "1"s in bit-flipped word, as shown in FIG. 8. For each step in j, either the number of bits flipped (k) is incremented, or the number of "1"s in $u_j$ is increased, but not both. Overall codeword disparity changes by ±2 with each step in j which means that the word will be balanced (target disparity=0) at some j.

Example pseudo code which may be used for implementing the second balanced zero sum coding method is as follows:

```
Let w = n-bit input word
Select set of {k_j, u_j} (see description above)
For j = 0 to n−1 + # of transitions
    Compute w^(kj) = w with first k_j bits flipped
    Select parity word u_j which corresponds to number of bits
    flipped (k_j) in balanced word
    If u_j w^(kj) has the same number of "1"s and "0"s, exit loop
Next j
Output codeword = u_j w^(kj)
```

Figure 9:
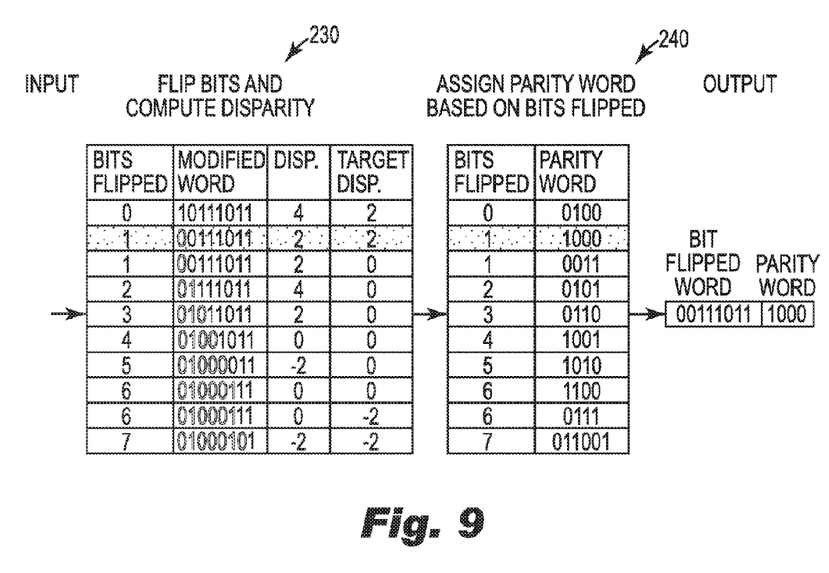
FIG. 9 shows is a diagram illustrating the number of bits flipped and an example assigned parity word for each number of bits flipped using a second balanced zero sum coding scheme (target disparity=0).

FIG. 9 shows is a diagram illustrating the number of bits flipped and an example assigned parity word for each number of bits flipped for an 8-bit data word using optimized parallel balanced zero sum coding. The input in this example is 10111011. The table indicated by reference numeral 230 in FIG. 9 shows optimized balanced disparity is achieved in this example after 1 bit is flipped with the parity word disparity of −2 (j=2), as the disparity between the number of ones and zeroes in the resulting modified word, 00111011, is equal the target ±bit-flipped-word disparity of 2. The table indicated by reference numeral 240 illustrates example parity words that may be assigned representing the number of bits flipped. In this example, because the target disparity was achieved after at the j=2 step (1 bit flipped with target disparity of 2), the parity word is 1000. The resulting 12-bit balanced code word is the modified, bit flipped word appended with the parity word, or 001110111000.

The second balanced and nearly balanced zero sum coding implementations presents a tradeoff. More bit-flipping steps are needed in order to accommodate parity words with finite disparity (as compared with the first balanced and nearly balanced zero sum coding implementations, respectively), but this allowed disparity allows a larger number of parity words for a given parity word size. Therefore, the set of parity words and the extent of their disparity may be chosen based on minimization of the parity word length for a given data word length. As before, there may be many choices of assignment of parity words to given number of bits flipped. In general, for the second balanced or nearly balanced zero sum coding implementations, sets of parity words may be chosen with increasing number of "1"s, along with an appropriate choice of number of bits flipped and target disparity for each step in j.

Figure 10:
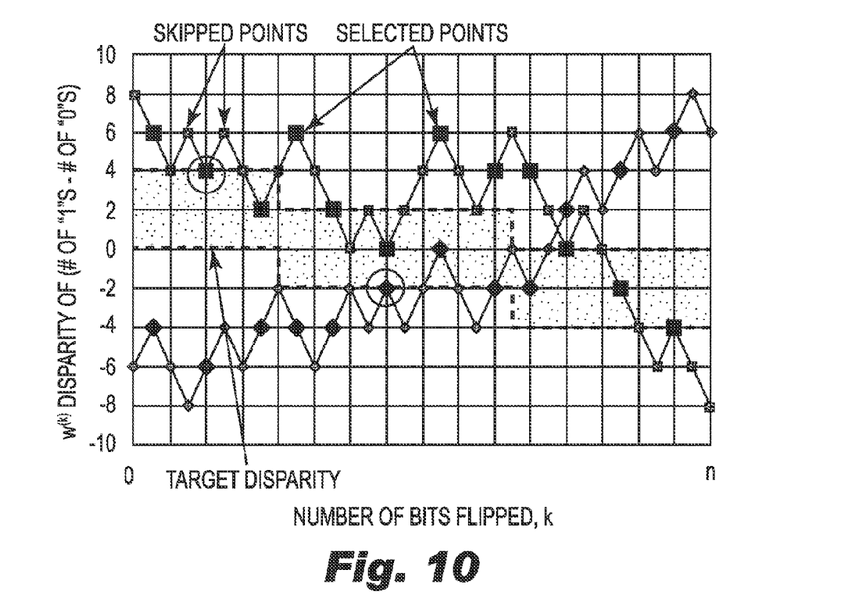
FIG. 10 is an example graph illustrating disparity versus bits flipped for two sample input codes using a second nearly balanced zero sum coding scheme (target disparity ±2).

FIG. 10 is an example graph illustrating disparity versus bits flipped for two sample input codes using the second nearly balanced zero sum coding implementation (target disparity ±2). The x-axis shows the number of bits flipped (k) and the y-axis shows the disparity $w^{(k)}$. In this example, the $u_j$ are not required to be balanced. The $u_j$ are arranged in order from smallest to largest number of "1"s, corresponding to changing the "target" number of "1"s in bit-flipped word. For each step in j, either the number of bits flipped (k) is incremented, or number of "1"s in $u_j$ is incremented, but not both. The implementation only needs to consider every third step in j for ±2 target disparity (at most one step away from balance). In general, every $(2+d)^{th}$ step is considered for ±d disparity.

Example pseudo code which may be used for implementing the second nearly balanced zero sum coding (target disparity ±2) is as follows:

cient coding scheme, and using the first and second zero sum coding methods described above (First ZS=first zero sum coding scheme, Second ZS=second zero sum coding scheme).

TABLE 5

Number of Coded Bits Needed for Different Coding/Signaling Schemes

| # of Data Bits | SE | Diff | Ideal ZS ± 0 | Ideal ZS ± 2 | Ideal ZS ± 4 | First ZS ± 0 | First ZS ± 2 | First ZS ± 4 | Second ZS ± 0 | Second ZS ± 2 | Second ZS ± 4 |
|---|---|---|---|---|---|---|---|---|---|---|---|
| 4  | 4  | 8   | 6  | 6  | 4  | 8  | 6  | 6  | 8  | 6  | 6  |
| 6  | 6  | 12  | 8  | 8  | 8  | 10 | 8  | 8  | 10 | 8  | 8  |
| 8  | 8  | 16  | 12 | 10 | 10 | 14 | 12 | 10 | 12 | 10 | 10 |
| 10 | 10 | 20  | 14 | 12 | 12 | 16 | 14 | 12 | 14 | 12 | 12 |
| 12 | 12 | 24  | 16 | 14 | 14 | 18 | 16 | 16 | 16 | 16 | 14 |
| 14 | 14 | 28  | 18 | 16 | 16 | 20 | 18 | 18 | 20 | 18 | 16 |
| 16 | 16 | 32  | 20 | 18 | 18 | 22 | 20 | 20 | 22 | 20 | 18 |
| 20 | 20 | 40  | 24 | 22 | 22 | 26 | 26 | 24 | 26 | 24 | 24 |
| 24 | 24 | 48  | 28 | 26 | 26 | 32 | 30 | 28 | 30 | 28 | 28 |
| 28 | 28 | 56  | 32 | 30 | 30 | 36 | 34 | 32 | 34 | 32 | 32 |
| 32 | 32 | 64  | 36 | 34 | 34 | 40 | 38 | 38 | 38 | 36 | 36 |
| 40 | 40 | 80  | 44 | 42 | 42 | 48 | 46 | 46 | 46 | 44 | 44 |
| 48 | 48 | 96  | 52 | 50 | 50 | 56 | 54 | 54 | 54 | 54 | 52 |
| 64 | 64 | 128 | 68 | 66 | 66 | 72 | 72 | 70 | 72 | 70 | 68 |
| 72 | 72 | 144 | 76 | 74 | 74 | 82 | 80 | 78 | 80 | 78 | 76 |

Figure 11:
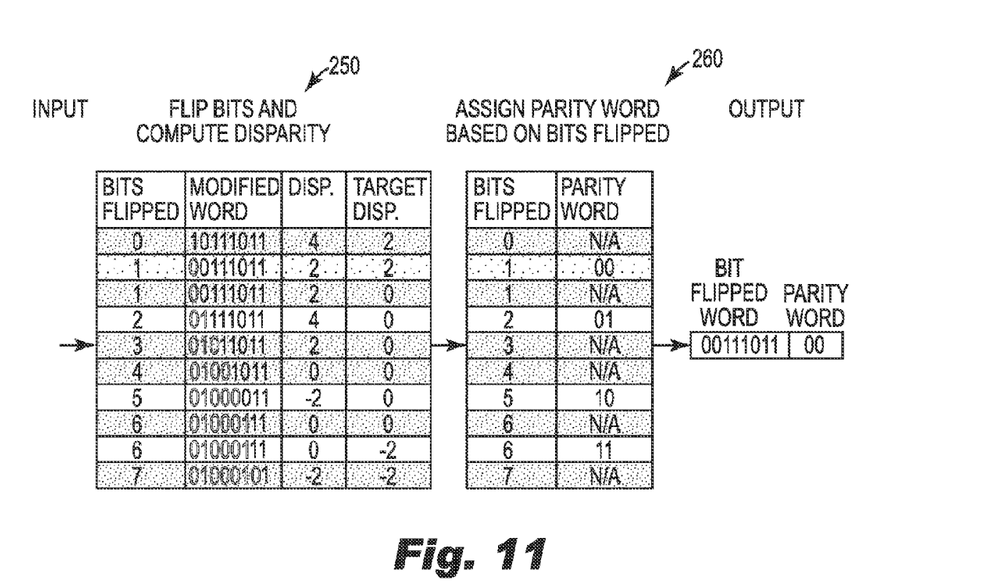
FIG. 11 shows is a diagram illustrating the number of bits flipped and an example assigned parity word for each number of bits flipped using the second nearly balanced zero sum coding scheme (target disparity ±2).

Let w = n-bit input word
Select set of $\{k_j, u_j\}$ (see description above)
For j = 0 to n−1 + # of transitions -continued Compute $w^{(kj)}$ = w with first $k_j$ bits flipped
Select parity word $u_j$ which corresponds to number of bits flipped ($k_j$) in balanced word
If $u_j w^{(kj)}$ has the same number of "1"s and "0"s ±2, exit loop
Next j
Output codeword = $u_j w^{(kj)}$ FIG. 11 shows is a diagram illustrating the number of bits flipped and an example assigned parity word for each number of bits flipped using the second nearly balanced zero sum coding implementation with finite target disparity (±2 in this example). The input in this example is 10111011. The table indicated by reference numeral 250 in FIG. 11 shows the target disparity of ±2 is achieved in this example after 1 bit is flipped, as the disparity between the number of ones and zeroes in the resulting modified word, 00111011, is within the target disparity of ±2. The table indicated by reference numeral 260 illustrates example parity words that may be assigned representing the number of bits flipped. In this example, because ±2 disparity was achieved after 1 bit was flipped, the parity word is 00. The resulting 10-bit zero sum data word is the modified, bit flipped word appended with the parity word, or 0011101100.

Note that there is a reduction in number of bit-flipped choices that need to be checked in this ±2 disparity method when compared with the second balanced zero sum coding implementation (disparity=0). This method may therefore be simpler to implement in hardware (with fewer logic elements). Also, note that the ±2 disparity second nearly balanced zero sum coding implementation may result in reduction in number of bits in the parity word as compared to the second balanced (target disparity of zero) implementation described above with respect to FIGS. 8 and 9. This may result in a corresponding reduction in the number of communication traces needed.

Figure 12:
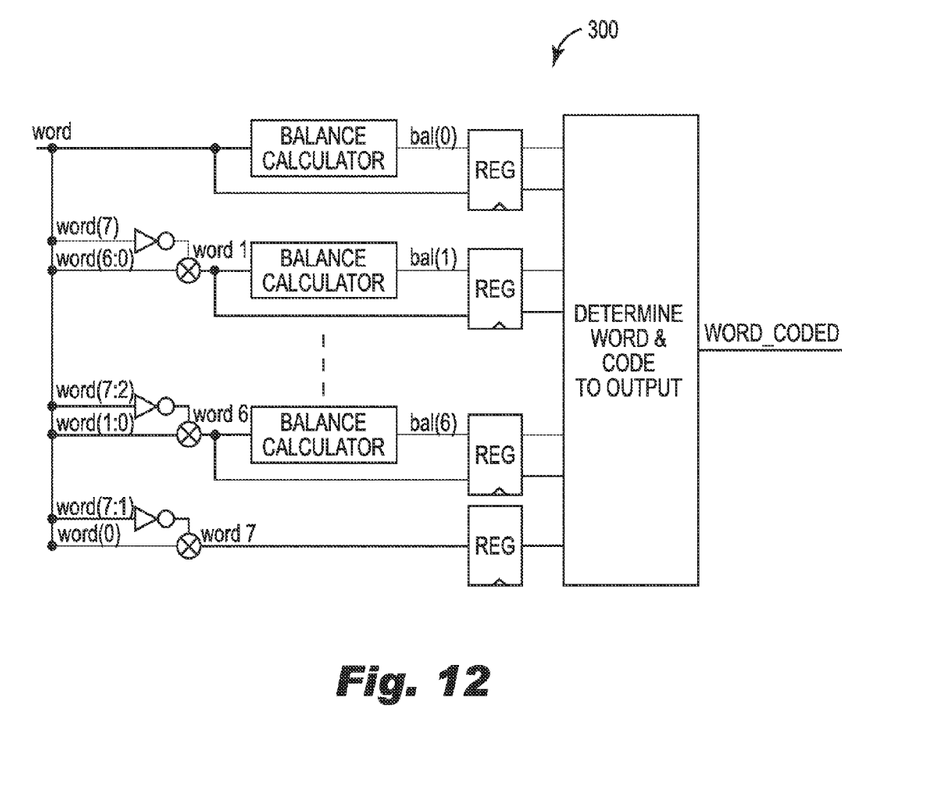
FIG. 12 is a block diagram illustrating an example parallel architecture implementation 300 for the first balanced (target disparity=0) zero sum coding scheme.
Figure 13:
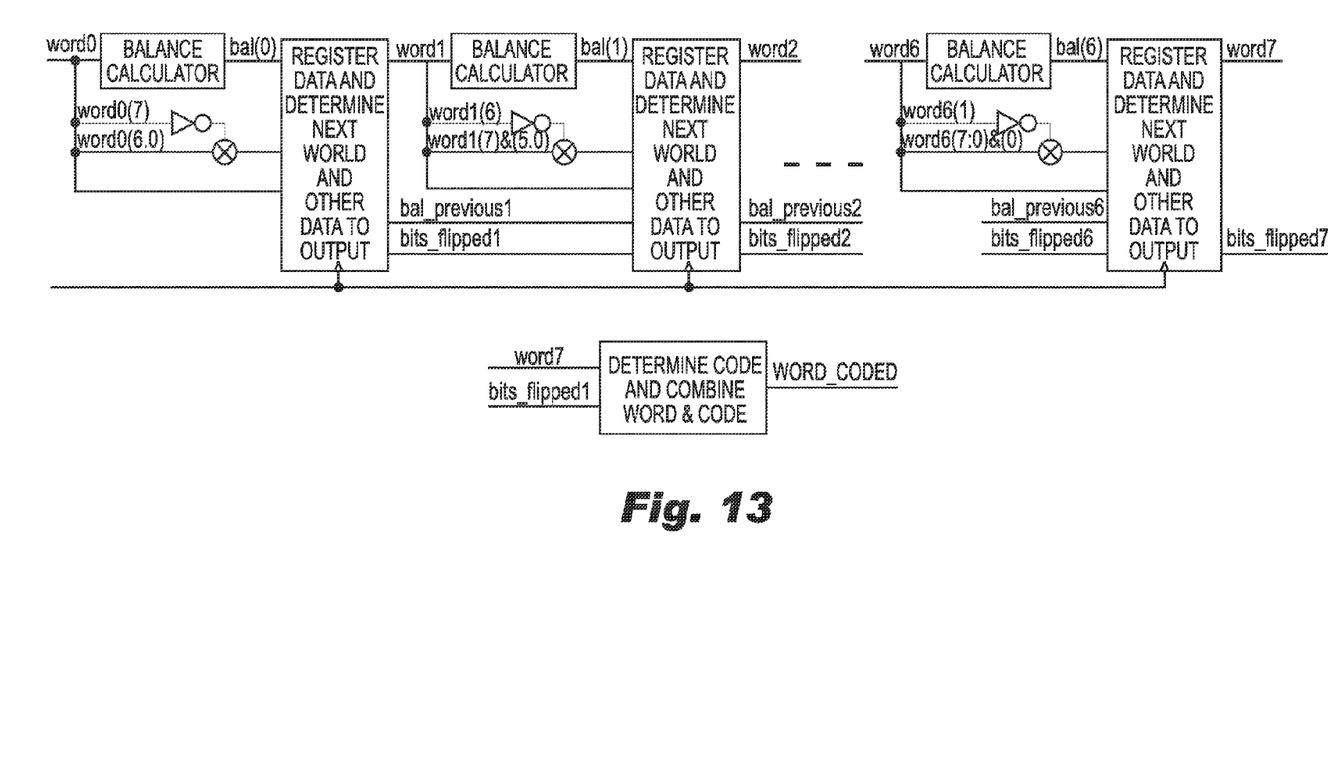
FIG. 13 is a block diagram illustrating an example pipelined architecture implementation for the first balanced (target disparity=0) zero sum coding scheme.

Table 5 below summarizes the total number of physical bits (or equivalently, physical traces) needed to encode a given number of data bits using conventional single-ended (SE) or differential (Diff) signaling, using an ideal or theoretical balanced zero sum (ZS) coding with a notional maximally effi- Balanced and nearly balanced zero sum coding implementations can be implemented in logic in many different ways. FIGS. 12 and 13 illustrate two examples. Although these examples specifically implement the first balanced and the first nearly balanced zero sum coding implementations, it shall be understood that each may be extended/modified to implement the other methods described herein. In addition, other implementation may also be used without departing from the scope of the present disclosure.

FIG. 12 is a block diagram illustrating an example parallel architecture implementation 300 for the first balanced zero sum coding scheme. The word length in FIG. 12 is 8-bits, although it shall be understood that the example implementation shown in FIG. 12 may be expanded to any desired number of bits. In this example, each of the input data word bit-flip choices and the resulting disparity (or balance) of these choices is computed in parallel. Following these computations, the word balanced with the fewest bit flips may be selected and output with the appropriate parity word.

FIG. 13 is a block diagram illustrating an example pipelined architecture implementation 400 for the first balanced zero sum coding scheme. The word length in FIG. 13 is 8-bits, although it shall be understood that the example implementation shown in FIG. 13 may be expanded to any desired number of bits. In this example, each of the input data word bit-flip choices and the resulting disparity (or balance) of these choices is computed in series. As these computations proceed, logic selecting the word balanced with the fewest bit flips is carried out, and finally is output with the appropriate parity word.

Referring again to FIG. 1, a balanced or nearly balanced zero sum signaling scheme may include a zero sum encoder 104 and a zero sum decoder 112. Example encoder/decoder implementations may employ a lookup table of codewords, where each data value represents an index into the lookup table. Codewords may be generated by selecting entries from the lookup table. For small sets of codewords, the entire table may be generated. For large sets of codewords, the lookup table may be populated with randomly chosen balanced (or nearly balanced) codewords.

Other techniques may also be used in combination with the zero sum signaling techniques described herein. For example, various techniques to eliminate crosstalk (e.g., the phenomenon by which a signal transmitted on one interconnect creates an undesired effect in another interconnect, typically caused by undesired capacitive, inductive, or conductive coupling from one interconnect to another) may be employed along with the zero sum signaling techniques. For example, it is well known that a single transmission line with a well-defined characteristic impedance may be terminated with a single resistor of the same value as the impedance, thereby eliminating reflections and providing an accurate replica of the input signal at the output. In principle, it is possible to do the same thing with a set of uniform coupled transmission lines with a well-defined characteristic impedance matrix. Terminations consisting of a network of resistances between signal lines, and between these lines and a reference voltage, can be provided to reduce or eliminate reflections, canceling the signal crosstalk (i.e. coupling of energy from one conductor to a nearby conductor) that would otherwise have been present. In principle, the use of a crosstalk cancellation network would allow nearby signaling lines to be packed together much more tightly, allowing the use of a greater number/density of parallel point-to-point links within a given package or printed circuit board footprint. Example crosstalk cancellation techniques are described in "High Speed Parallel Signal Crosstalk Cancellation Concept," DesignCon 2011 proceedings.

Various examples have been described. These and other examples are within the scope of the following claims.

The invention claimed is:

1. A system comprising:
a plurality of devices that communicate using n-bit data words, each associated with a different one of a plurality of encoders and a different one of a plurality of decoders;
wherein each of the plurality of encoders receives an n-bit data word from the associated device and encodes the n-bit data word into a corresponding (n+p)-bit data word comprised of an n-bit modified data word and a p-bit parity word, the n-bit modified data word having a number of ones and a number of zeroes, wherein the number of ones is within a disparity ±d as compared to the number of zeroes, and wherein the number of bits p in the p-bit parity word decreases as an absolute value of the disparity ±d increases; and
a plurality of interconnects that route the (n+p)-bit modified data words between the plurality of devices; and
wherein each of the plurality of decoders receives one or more of the (n+p)-bit modified data words and decodes the received one or more of the (n+p)-bit modified data words into the corresponding n-bit data words for receipt by the associated one of the plurality of devices.

2. The system of claim 1 wherein the disparity d is any positive integer.

3. The system of claim 1 wherein the disparity d is one of ±2 or ±4.

4. The system of claim 1 wherein at least one of the plurality of devices is a processor and at least one of the plurality of devices is a memory.

5. The system of claim 1 wherein the disparity ±d equals zero.

6. The system of claim 1 wherein the (n+p)-bit data word is a balanced (n+p)-bit data word, and the n-bit modified data word includes an equal number of ones and zeroes.

7. The system of claim 1 wherein a number of interconnects in the plurality of interconnects is relatively lower when the disparity d is non-zero as compared to when disparity ±d equals zero.

8. The system of claim 1 wherein the encoder successively complements one bit of the n-bit data word until the n-bit modified data word having the number of ones within the disparity ±d as compared to the number of zeroes code is achieved.

9. The system of claim 8 wherein the encoder assigns the p-bit parity word based on how many bits of the n-bit data word are complemented to achieve the n-bit modified data word having a number of ones within the disparity ±d as compared to the number of zeroes.

10. A method comprising:
generating an n-bit data word at a first device;
encoding the n-bit data word into a corresponding (n+p)-bit data word comprised of an n-bit modified data word and a p-bit parity word, the n-bit modified data word having a number of ones and a number of zeroes, wherein the number of ones is within a disparity ±d as compared to the number of zeroes and wherein a number of bits p in the p-bit parity word decreases as an absolute value of the disparity ±d increases;
transmitting the (n+p)-bit data word; and
decoding the (n+p)-bit data word into the corresponding n-bit data word for receipt by the second device.

11. The method of claim 10 wherein encoding the n-bit data word into a corresponding (n+p)-bit data word further includes successively complementing one bit of the n-bit data word until the n-bit modified data word having a number of ones within the disparity ±d as compared to the number of zeroes code is achieved.

12. The method of claim 11 further comprising assigning the p-bit parity word based on how many bits of the n-bit data word are complemented to achieve the n-bit modified data word having a number of ones within the disparity ±d as compared to the number of zeroes.

13. A system comprising:
a first device and a second device that communicate using n-bit data words;
an encoder associated with a first processing element that receives an n-bit data word from the first processing element and encodes the n-bit data word into a corresponding (n+p)-bit data word comprised of an n-bit modified data word and a p-bit parity word, the n-bit modified data word having a number of ones and a number of zeroes, wherein the number of ones is within a disparity ±d as compared to the number of zeroes, and wherein a number of bits p in the p-bit parity word decreases as an absolute value of the disparity ±d increases; and
a decoder associated with a second processing element that decodes the (n+p)-bit data word into the corresponding n-bit data word for receipt by a second processing element.

14. The system of claim 13 wherein the disparity ±d is any integer.

15. The system of claim 13 wherein the disparity ±d is one of ±2 or ±4.

16. The system of claim 13 wherein the first device is one of a processing element and a memory.

17. A method comprising:
generating an n-bit data word at a first device;
encoding the n-bit data word into a corresponding (n+p)-bit data word comprised of an n-bit modified data word and a p-bit parity word, the n-bit modified data word having a number of ones and a number of zeroes, wherein the number of ones is within a disparity ±d as compared to the number of zeroes and wherein a number of bits p in the p-bit parity word is relatively lower when the disparity d is non-zero as compared to when disparity ±d equals zero;

transmitting the (n+p)-bit data word; and decoding the (n+p)-bit data word into the corresponding n-bit data word for receipt by the second device.

18. A system comprising:

a first device and a second device that communicate using n-bit data words;

an encoder associated with a first processing element that receives an n-bit data word from the first processing element and encodes the n-bit data word into a corresponding (n+p)-bit data word comprised of an n-bit modified data word and a p-bit parity word, the n-bit modified data word having a number of ones and a number of zeroes, wherein the number of ones is within a disparity ±d as compared to the number of zeroes, and wherein a number of bits p in the p-bit parity word is relatively lower when the disparity d is non-zero as compared to when disparity ±d equals zero; and a decoder associated with a second processing element that decodes the (n+p)-bit data word into the corresponding n-bit data word for receipt by a second processing element.

19. A system comprising:

a plurality of devices that communicate using n-bit data words, each associated with a different one of a plurality of encoders and a different one of a plurality of decoders;

wherein each of the plurality of encoders receives an n-bit data word from the associated device and encodes the n-bit data word into a corresponding (n+p)-bit data word comprised of an n-bit modified data word and a p-bit parity word, the n-bit modified data word having a number of ones and a number of zeroes, wherein the number of ones is within a disparity ±d as compared to the number of zeroes, and wherein the number of bits p in the p-bit parity word is relatively lower when the disparity d is non-zero as compared to when disparity ±d equals zero; and a plurality of interconnects that route the (n+p)-bit modified data words between the plurality of devices; and wherein each of the plurality of decoders receives one or more of the (n+p)-bit modified data words and decodes the received one or more of the (n+p)-bit modified data words into the corresponding n-bit data words for receipt by the associated one of the plurality of devices.

\* \* \* \* \*